United States Patent [19]
Giridhar et al.

[11] Patent Number: 5,139,971
[45] Date of Patent: Aug. 18, 1992

[54] ANNEAL TO DECREASE MOISTURE ABSORBANCE OF INTERMETAL DIELECTRICS

[75] Inventors: Ragupathy V. Giridhar, San Jose; Philip E. Freiberger, Santa Clara; Brian A. Kaiser, Redwood City; Yi-Ching Lin, Sunnyvale, all of Calif.

[73] Assignee: Intel Corporation, Santa Clara, Calif.

[21] Appl. No.: 712,116

[22] Filed: Jun. 7, 1991

[51] Int. Cl.$^5$ .................... H01L 21/283; H01L 21/56
[52] U.S. Cl. ................................. 437/195; 437/238; 437/247
[58] Field of Search ............... 437/195, 247, 238, 240, 437/241, 937, 949

[56] References Cited

U.S. PATENT DOCUMENTS 4,349,609  9/1982  Takeda et al. .................. 437/203

FOREIGN PATENT DOCUMENTS 56-155526  12/1981  Japan .................. 437/937
2-5551     1/1990   Japan .

OTHER PUBLICATIONS

Ghandhi, S. K., VSLI Fabrication Principles, John Wiley & Sons, 1983, pp. 420–430.
Hawley's Condensed Chemical Dictionary, 1987, Van Nostrand Reinhold Company, p. 1146.

Primary Examiner—T. N. Quach
Attorney, Agent, or Firm—Blakely, Sokoloff, Taylor & Zafman

[57] ABSTRACT

A method of forming a device having an intermetal dielectric film which is formed and annealed to prevent a significant quantity of ambient moisture from being absorbed by the intermetal dielectric film prior to passivation layer deposition is disclosed. An intermetal dielectric layer is formed over a substrate having a interconnection layer. A second interconnect layer is formed over the IMD layer. The substrate with the intermetal dielectric is annealed anytime between IMD formation and passivation layer deposition to produce a film that does not absorb a significant quantity of ambient moisture, and therefore, longer queue times can be utilized between the anneal and subsequent processing. The present invention reduces the amount of water in the device which reduces hot electron induced device degradation.

14 Claims, 1 Drawing Sheet

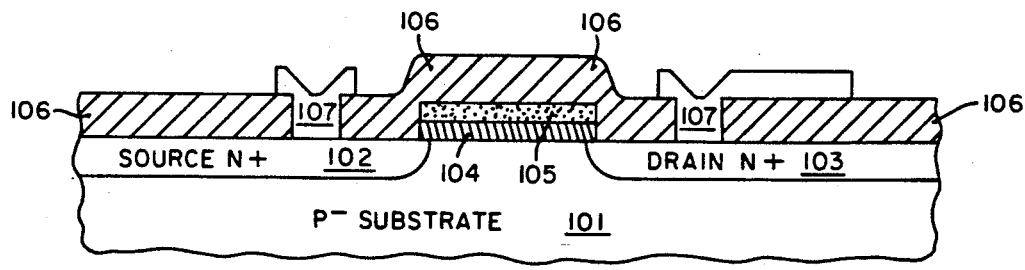
FIG_1
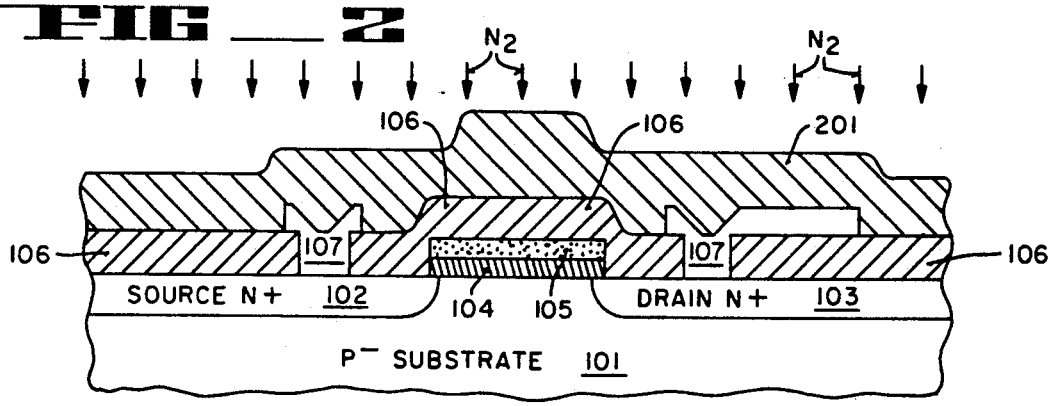
FIG_2
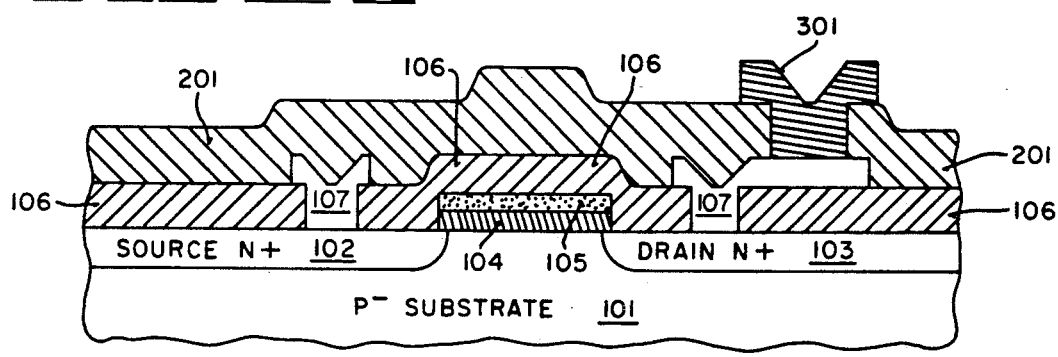
FIG_3
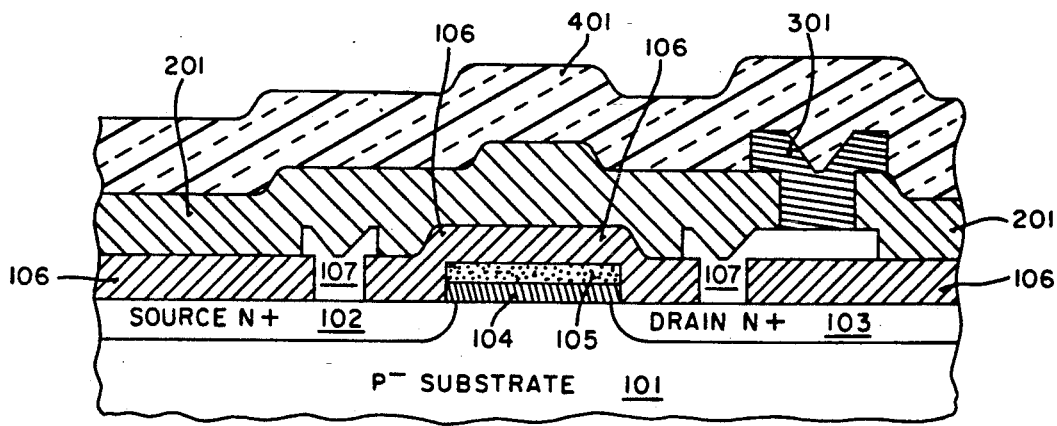
FIG_4

ANNEAL TO DECREASE MOISTURE ABSORBANCE OF INTERMETAL DIELECTRICS

FIELD OF THE INVENTION

The present invention relates generally to the field of processing semiconductor devices, and in particular, to the formation of an intermetal dielectric film on semiconductor substrates containing such devices.

BACKGROUND OF THE INVENTION

Metal oxide semiconductor (MOS) technology is used to form a number of different types of devices which include semiconductor memory devices dependent on hot electron programming. When programming one type of these devices, hot electrons are injected from the drain through the tunnel dielectric and into the floating gate. As such, hot electrons are present during programming and do not give rise to any adverse effects. On the other hand, when a high hot electron concentration occurs in a MOS transistor, several problems can arise including hot electron induced device degradation. Hot electrons may have sufficient energy to damage the substrate-gate dielectric interface near the drain edge that may cause to adverse changes in the transistor characteristics.

Certain types of intermetal dielectrics have been found to cause problems with hot electrons at the substrate-gate dielectric interface near the drain. In the prior art, annealing intermetal dielectric layers for densification and driving out moisture is not performed. An intermetal dielectric (IMD) film typically absorbs ambient moisture and when the device is passivated, the moisture is trapped. Subsequent heat cycles may drive the moisture into the gate oxide region. In the prior art, the hot electron susceptibility of transistors using wet gate oxides is known to be inferior to those of transistors using dry chlorinated gate oxides. Therefore, water absorbed into the IMD film could migrate to the gate dielectric thereby making a device more susceptible to hot electron induced device degradation.

A number of prior art attempts have not yielded adequate results, one of which includes placing a moisture barrier in the form of gate sidewall spacers comprised of a material such as silicon nitride near the gate of the device. Silicon nitride causes device instability because hot electrons are trapped in the silicon nitride and near the gate.

Another prior art attempt minimizes the exposure of the IMD film to air between the steps of IMD film deposition and passivation deposition. This processing sequence has serious drawbacks in a manufacturing environment because it is typically difficult to guarantee that the equipment used for subsequent steps would be available immediately following the IMD deposition. As such, a sufficiently short queue time between IMD deposition and passivation deposition which is typically a few processing steps later in the process flow has proven to be impractical.

A high density IMD film absorbs ambient moisture at a rate greater than desired, although the ambient moisture absorbance rate is less than a low density IMD film. Because of the ambient moisture absorbance rate, a short queue time between IMD film deposition and passivation deposition may be required even for a high density IMD film. Even if a queue time can be tolerated, enough ambient moisture may be absorbed and cause the hot electron induced device degradation previously described.

SUMMARY OF THE INVENTION

As will be described in more detail hereinafter, the present invention includes a method of forming a device having a first interconnection layer. An intermetal dielectric layer is deposited over a substrate. A second interconnection layer is deposited on the substrate. The intermetal dielectric is annealed. The anneal is performed between the intermetal dielectric deposition and a second dielectric layer deposition that acts as a passivation layer. Preferably, the anneal is performed as soon as possible after the intermetal dielectric deposition with a nonreactive gas at about 400° C. for between one and two hours.

The annealed IMD film produced in accordance with the present invention does not significantly absorb ambient moisture. Therefore, long queue times between the anneal and passivation deposition can be tolerated. A device formed in accordance to the present invention has less susceptibility to hot electron induced device degradation.

BRIEF DESCRIPTION OF THE DRAWINGS

FIG. 1 is a cross sectional elevation view of a portion of a substrate which slows a metal oxide semiconductor device with a first interconnection layer prior to the formation of the intermetal dielectric layer.

FIG. 2 is an illustration of the substrate in FIG. 1 after forming and annealing an intermetal dielectric in accordance with the present invention.

FIG. 3 shows the device of FIG. 2 after the intermetal dielectric is patterned and a second interconnection layer is formed at the opening in the intermetal dielectric.

FIG. 4 shows the device of FIG. 3 after a passivation layer is formed over the second interconnection layer.

DETAILED DESCRIPTION OF THE PRESENT INVENTION

The invention disclosed herein is directed to a method of forming an intermetal dielectric (IMD) film having a reduced ambient moisture absorbance rate. The invention can be used to form and anneal dielectric layers between any conductive layers (such as polysilicon, silicide, barrier layers, metals, and other conductive interconnection materials) on a semiconductor substrate. In the following description, numerous details are set forth, such as specific materials, processing parameters, etc., in order to provide a thorough understanding of the present invention. It will be obvious, however, to one skilled in the art that these specific details need not be employed to practice the present invention. In other instances, well-known processing steps are not described in detail in order not to unnecessarily obscure the present invention. This section sets forth the general principles of the present invention, describes the currently preferred embodiment of the present invention, and finishes with alternate embodiments of the present invention.

The method of the present invention forms and anneals an IMD film so that the IMD film does not absorb a significant quantity of ambient moisture following the anneal. Therefore, very long queue times (longer than days) between the anneal and the subsequent processing steps can be tolerated without producing hot electron induced device degradation within a device. Hot electron induced device degradation is reduced when an IMD film is formed and annealed in accordance with the present invention. Data collected on an IMD film formed and annealed in accordance with the present invention indicates that hot electron degradation within a n-channel MOS transistor is reduced as determined by measuring peak transconductance of the cells before and after stressing the transistor. In the preferred embodiment, the present invention is used with 0.8μm technology devices, yet, in alternative embodiments, the present invention can be used on devices manufactured using technologies other than 0.8μm. Having described the general principles involved with the invention, discussion is now directed to the method of annealing the IMD film as described below.

FIG. 1 illustrated a MOS device before the formation of the IMD layer. During the early portion of the processing steps, the MOS device is formed by steps well known in the art. The substrate 101 is a lightly p-type doped monocrystalline material. A source 102 and drain 103 are heavily doped with a n-type dopant and are formed within the monocrystalline material. A gate dielectric 104 and gate electrode 105 lie above the substrate and the ends of both extend slightly over a portion of both the source 102 and the drain 103. The gate dielectric 104 is usually made of high quality silicon dioxide, and the gate electrode 105 is usually made of heavily doped polycrystalline silicon (polysilicon) which may be subsequently silicided. A patterned pre-metal dielectric layer 106 is formed over the device. The pre-metal dielectric layer 106 is usually made of chemically deposited silicon dioxide doped with boron and phosphorus. A first metalization layer 107 is formed and makes contact to predetermined areas of the substrate. As illustrated, the first metalization layer 107 makes contact to the source 102 and drain 103. All of the steps prior to the formation of the IMD film are well known in the prior art.

After forming a MOS device with a first metalization layer as previously described, an IMD film 201 is formed. In the currently preferred embodiment, the IMD film 201 is deposited using the method listed in a patent application entitled "High Density TEOS-Based Film for Intermetal Dielectrics" which is Ser. No. 07/712,115 filed Jun. 7, 1991 and is assigned to the same company as the present invention.

Following the deposition of the IMD film 201, the film is annealed in accordance with the present invention and is illustrated in FIG. 2. In the currently preferred embodiment, the IMD film is annealed in gaseous nitrogen near atmospheric pressure at about 400° C. for one to two hours and the anneal is performed as soon as possible after the IMD film 201 is deposited. The present invention has numerous alternate embodiments that are described below in greater detail.

The annealed IMD film formed in accordance with the present invention has advantages over an unannealed IMD film one of which is less hot electron induced device degradation. The prior art unannealed IMD films could absorb ambient moisture at a greater rate. During a subsequent high temperature process, the water within the film could migrate to the gate dielectric thereby making a device more susceptible to hot electron induced device degradation as previously discussed. A device formed by the prior art methods is more likely to have hot electron induced device degradation. Unlike the prior art devices, a device formed in accordance to the present invention absorbs less ambient moisture, and therefore, the IMD film 201 has less water that could migrate to the gate dielectric. A device formed in accordance to the present invention is less susceptible to hot electron induced device degradation compared to the prior art.

In addition to reducing hot electron induced device degradation, devices formed in accordance with the present invention should not require any special queue time between annealing and subsequent processing steps due to ambient moisture absorbance. In a manufacturing environment, it is typically difficult to guarantee that processing equipment used for subsequent steps such as metal deposition, metal patterning, etc., are available immediately following the IMD deposition. The IMD film formed by prior art methods may continue to absorb ambient moisture until a final passivation layer is formed over the device. The process sequence may have several processing steps between IMD film formation and passivation layer formation and could result in more than a week passing between the two processing steps. The IMD film annealed in accordance to the present invention has a reduced ambient moisture absorbance rate, and therefore, longer queue times between the IMD film anneal and passivation depostion steps may be possible. Queue times between the anneal and subsequent steps may extend beyond several days allowing more flexibility in production schedules.

A masking layer is deposited over the IMD film 201. Using well known lithographic techniques, openings are forming in the masking layer at predetermined locations. An opening is etched in the IMD film 201 using well known etching techniques employed for etching silicon dioxide, silicon oxynitride, or silicon nitride layers, so that an second metalization layer 301 may contact the first metalization layer at the predetermined location as illustrated in FIG. 3. The second metalization layer 301 may use the same or different materials as the first metalization layer 107. Some devices may require additional metalization layers with IMD films between them. All of the IMD films and their corresponding anneals are formed in accordance with the present invention. Following the formation of the last metalization layer, the devices are further processed as illustrated in FIG. 4. A passivation layer 401 which is typically a dielectric layer such as silicon oxynitride, silicon nitride, polyimide, etc., has been deposited over the second metalization layer 301. The passivation layer 401 protects the underlying layers of the device from scratches, moisture, and other contaminants. Additional processing continues until finished devices are formed. The formation of all of the metalization layers and processing steps following the formation of the last metalization layer are well known in the art.

The present invention uses an IMD film may include silicon-nitrogen compounds although their use may be limited by other processing considerations. When present at the gate, silicon nitride traps hot electrons below the silicon nitride layer and may cause hot electron induced device degradation. Because the IMD film does not come in contact with the gate, hot electron induced degradation should not be a problem.

The following alternate embodiments are presented to illustrate processing options available to a practitioner skilled in the art and are not intended to limit the scope of the present invention. While experiments have been performed with the aforementioned TEOS-based IMD film, IMD films comprised of other materials should have similarly reduced ambient moisture absorbance rates following an anneal in accordance with the present invention. Alternate embodiments of forming the IMD film include other silicon sources such as silane, disilane, and diethyl silane. Species that produce oxygen and nitrogen (oxygen, ozone, nitrous oxide, and ammonia) and dopants (diborane, trimethyl borate, phosphine, and trimethyl phosphite) may be used in forming the IMD film. An IMD film may include silicon dioxide, silicon oxynitride, silicon nitride, as well as the doped and undoped versions of each.

Gases which do not react with the IMD film (herein referred to as nonreactive gases) may be used for the present invention. These gases include argon, helium, and hydrogen in addition to the previously stated nitrogen. The anneal ambient of the present invention can vary from atmospheric pressure although no know limits exist for the pressure. If the pressure is too high, the amount of trace contaminants increase which may give unwanted reactions within the IMD film or underlying layer. Along a similar line, gases which are normally nonreactive at atmospheric pressure may become more reactive as the partial pressure of that specific gas increases.

The degree of annealing is a function of time and temperature. The anneal temperature should be between 350° C. and 450° C. although temperatures in the range from 300° C. and 550° C. should sufficiently anneal the IMD film. Similar to the ambient pressure, no known limits on temperature are known, but may be limited by other processing considerations not related to the IMD film. Below 300° C., the anneal of the IMD film may be insufficient and may allow ambient moisture to become significantly absorbed by the IMD film. Above 550° C., the barrier layer integrity may degrade and could allow the substrate 101 and the first metal layer 107 to interact with one another which is what the barrier layer is to prevent. Temperatures higher than 550° C. may be utilized if the layers beneath the IMD film can tolerate those temperatures and if little or no contaminants which affect device performance are present during the anneal. The time needed for the anneal is partially determined by temperature with higher anneal temperatures requiring less anneal time. Anneal times of 0.5 to 30.0 hours should be adequate for most uses. The anneal time may be limited to a time when barrier layer integrity noticeably decreases. Anneal times outside of this range may cause problems similar to those expected for temperatures outside of its recommended range.

In an alternate embodiment, an anneal in accordance to the present invention may be done any time between IMD deposition and passivation layer deposition as long as the annealing gas does not react with the exposed surfaces of the substrate or allow contaminants that may be present within the annealing chamber to effect the substrate. Resistance to hot electron induced device degradation improves as the anneal is done closer in time to the IMD deposition.

Development of new semiconductor processing techniques have been phenomenal over the past few years. In the future, processing equipment may be able to deposit a patterned IMD film rather than the current blanket deposition followed by etching openings in the IMD film. The present invention can be utilized with a patterned IMD film as deposited if the first metalization layer does not react with the annealing gases or contaminants that may be present within the annealing chamber. The anneal is performed after the patterned IMD film is deposited as previously described.

The invention has been described in conjunction with MOS devices. The benefits of the invention may be achieved with other semiconductor devices such as bipolar devices. The invention should be utilized when a dielectric which absorbs little if any ambient moisture is desired.

The method of the present invention forms and anneals an IMD film so that is does not absorb a significant amount of ambient moisture following the anneal. Longer queue times compared to the prior art can be tolerated between the anneal and passivation deposition step. Therefore, a device with less hot electron induced degradation is achieved with this invention.

Thus, a method of forming a device including annealing an IMD film so that is does not absorb a significant quantity of ambient moisture thereby producing a device which has less hot electron induced degradation has been described.

What is claimed is:

1. A method of forming a semiconductor device comprising the steps of:
    (a) forming a first interconnection layer over a substrate;
    (b) forming a first dielectric layer over said first interconnection layer, said first dielectric layer comprising a material selected from the group consisting of silicon dioxide, silicon oxynitride, silicon nitride, and a combination thereof;
    (c) annealing said first dielectric layer in a nonreactive ambient at a temperature between about 300° C. to about 550° C. for a time between about 0.5 and about 30.0 hours such that said first dielectric layer absorbs ambient moisture at a reduced rate, thereby forming a device having less hot electron induced device degradation, said anneal being performed while at least a portion of said first dielectric layer is exposed to said ambient;
    (d) forming a second interconnection layer; and
    (e) forming a second dielectric layer over said second interconnection layer, said second dielectric layer preventing scratches and moisture from reaching the layers under said second dielectric layer.

2. The method of claim 1 wherein said ambient is a gas selected from the group consisting of argon, helium, nitrogen, hydrogen, and a combination thereof.

3. The method of claim 1 wherein said temperatures is between about 350° C. to about 450° C.

4. The method of claim 3 wherein said time is about one to two hours.

5. The method of claim 1 wherein said anneal is performed at about atmospheric pressure.

6. A method of forming a semiconductor device comprising the steps of:
    (a) forming a first interconnection layer over a substrate;
    (b) forming silicon dioxide layer over said first interconnection layer;
    (c) annealing said silicon dioxide layer in a nonreactive ambient at about atmospheric pressure at a temperature of about 400° C. for a time between about one and about two hours such that said silicon dioxide layer absorbs ambient moisture at a reduced rate, thereby forming a device having less hot electron induced device degradation;
    (d) after annealing said silicon dioxide layer, forming a second interconnection layer; and
    (e) after forming said second interconnection layer, forming a dielectric layer over said second interconnection layer, said dielectric layer preventing scratches and moisture from reaching the layers under said dielectric layer.

7. The method of claim 6 wherein said ambient is a gas selected from the group consisting of argon, helium, nitrogen, hydrogen, and a combination thereof.

8. A method of forming a semiconductor device comprising the steps of:
   (a) forming a first interconnection layer over a substrate;
   (b) forming a first dielectric layer over said first interconnection layer, said first dielectric layer comprising a material selected from the group consisting of silicon dioxide, silicon oxynitride, silicon nitride, and a combination thereof;
   (c) annealing said first dielectric layer in a nonreactive ambient at a temperature between about 300° C. to about 550° C. for a time between about 0.5 and about 30.0 hours, said anneal being performed prior to any subsequent layer being formed on said first dielectric layer;
   (d) forming a second interconnection layer; and
   (e) forming a second dielectric layer over said second interconnection layer, said second dielectric layer preventing scratches and moisture from reaching the layers under said second dielectric layer.

9. The method of claim 8 wherein said ambient is a gas selected from the group consisting of argon, helium, nitrogen, hydrogen, and a combination thereof.

10. The method of claim 8 wherein said temperatures is between about 350° C. to about 450° C.

11. The method of claim 10 wherein said time is about one to two hours.

12. The method of claim 8 wherein said anneal is performed at about atmospheric pressure.

13. A method of forming a semiconductor device comprising the steps of:
   (a) forming a first interconnection layer over a substrate;
   (b) forming a silicon dioxide layer over said first interconnection layer;
   (c) annealing said silicon dioxide layer in a nonreactive ambient at about atmospheric pressure at a temperature of about 400° C. for a time between about one and about two hours, said anneal being performed prior to any subsequent layer being formed on said silicon dioxide layer;
   (d) after annealing said silicon dioxide layer, forming a second interconnection layer; and
   (e) after forming said second interconnection layer, forming a dielectric layer over said second interconnection layer, said dielectric layer preventing scratches and moisture from reaching the layers under said dielectric layer.

14. The method of claim 13 wherein said ambient is a gas selected from the group consisting of argon, helium, nitrogen, hydrogen, and a combination thereof.

* * * * *